United States Patent [19]

Powell et al.

[11] Patent Number: 5,162,801
[45] Date of Patent: Nov. 10, 1992

[54] LOW NOISE SWITCHED CAPACITOR DIGITAL-TO-ANALOG CONVERTER

[75] Inventors: Scott R. Powell, Carlsbad; Anthony G. Mellissinos, Encinitas, both of Calif.

[73] Assignee: Hughes Aircraft Company, Los Angeles, Calif.

[21] Appl. No.: 801,145

[22] Filed: Dec. 2, 1991

[51] Int. Cl.[5] ............ H03M 1/78; H03M 1/80; H03M 1/06
[52] U.S. Cl. ............ 341/150; 341/153; 341/118
[58] Field of Search ............ 341/150, 153, 144, 118, 341/119

[56] References Cited

U.S. PATENT DOCUMENTS 4,077,035  2/1978  Yee ............... 341/153 X
4,667,179  5/1987  Law et al. ............... 341/150

OTHER PUBLICATIONS

"Analog MS Integrated Circuits for Signal Processing" R. Gregorian et al., published by Wiley, pp. 417 et seq.

Primary Examiner—Sharon D. Logan
Attorney, Agent, or Firm—W. C. Schubert; W. K. Denson-Low

[57] ABSTRACT

A low-noise switched-capacitor DAC converts an integer number from an N-bit digital format into an analog voltage level by transferring charge between two appropriately ratioed capacitors using a plurality of switches. The switches select only an appropriate one of a plurality of capacitors to connect to an operational amplifier in accordance with any digital input. The sampled kT/C noise and switch charge injection from an N-bit DAC is thus beneficially reduced.

13 Claims, 2 Drawing Sheets

LOW NOISE SWITCHED CAPACITOR DIGITAL-TO-ANALOG CONVERTER

GOVERNMENT RIGHTS

This invention was made with Government support under contract No. N66001-86-C-0193 awarded by the Department of the Navy. The Government has certain rights in this invention.

FIELD OF THE INVENTION

The invention relates to digital-to-analog (DAC) converter devices and more particularly, to those devices using switches capacitors to develop an analog output.

BACKGROUND OF THE INVENTION

In the prior art, switches capacitor DAC circuits have relied on either a binary-weighted array of capacitors, a Capacitor 2-Capacitor (C-2C) ladder circuit, or a combination of both techniques to derive the output signal level. In such arrangements, N capacitor or ladder branches are switches so that the summation of charge from all branches is proportional to the desired analog output level. See, for example, *Analog MOS Integrated Circuits*, published by Wiley, at pp. 417 et.-seq.

A primary disadvantage of these circuits is that the charge from each branch carries a sampled thermal noise component, proportional to kT/C, and an error component due to switch charge injection. Since, in these circuits, each branch's noise component is uncorrelated with the noise from the other branches, the individual noise variances in each branch are additive which results in a total noise variance of N*(kT/C). In order to maintain this noise at an acceptably small level, it will be appreciated that for many applications unacceptably large values of capacitance, C, can be required to obtain acceptable resolution. Also, the charge injected by each switch will sum and appear as an error voltage at the output.

Since power dissipation in these devices is also proportional to C, the resolution requirement must be met by also increasing the power requirement.

SUMMARY OF THE INVENTION

It is therefore an object of the invention to provide a switched capacitor DAC which has a reduced noise component and which therefore enables the use of lower capacitor values in the implementation of the circuit.

It is a further object to provide a DAC having potentially lower power requirements while maintaining acceptable resolution.

The foregoing and other problems are overcome and the objects of the invention are realized by a low-noise switched-capacitor DAC which converts an integer number from an N-bit digital format into an analog voltage level by transferring charge between two appropriately ratioed capacitors using switches. With proper control of these switches, the sampled kT/C noise and the switch charge injection from an N-bit DAC is reduced.

In accordance with the invention, there is provided a DAC circuit that includes an operational amplifier having an output terminal and an input terminal, a reference capacitor connected between the output terminal and the input terminal, and a plurality of capacitors switchably connected to the input terminal of the operational amplifier. Each of the capacitors has a different capacitance value. The DAC circuit further includes circuitry for selectively switchably connecting each of the plurality of capacitors to a voltage source for developing a voltage across the capacitors and the reference capacitor. The switching circuitry is operative for causing a selection of one of the capacitors, in correspondence with a received digital signal to develop the voltage, and for causing the other capacitors to remain in a floating voltage state.

The switching circuitry may further simultaneously discharge the plurality of capacitors.

In a further aspect, the invention provides a method for converting a digital value to an analog signal level. The method includes the steps of (a) providing an operational amplifier having an input terminal and an output terminal, (b) connecting a reference capacitor between the input and output terminals, (c) connecting a plurality of capacitors to the input terminal, (d) selecting one of the plurality of capacitors in correspondence with a determined digital value, and (e) applying a voltage thereto to establish a selected voltage output at the output terminal of the operational amplifier while allowing each of the others of the plurality of capacitors to remain in a floating voltage state. As a result, the thermal noise and charge injection of the others of the capacitors do not contribute noise to the output signal level at the output terminal of the operational amplifier.

The disclosed circuit has applications in switched capacitor circuits that require a relatively low precision DAC. Oversampled sigma-delta type ADC or DAC systems require such a circuit and represent a primary application of the low noise switched capacitor DAC.

It will be appreciated that the DAC in accordance with the invention reduces the sampled thermal noise and charge injection error, thereby offering increases in overall resolution (equivalent bits) for oversampled sigma-delta converters. Since, as previously pointed out, power dissipation is proportional to capacitance, C, the disclosed technique additionally offers a potential for reduced operating power.

BRIEF DESCRIPTION OF THE DRAWING

The above set forth and other features of the invention are made more apparent in the ensuing Detailed Description of the Invention when read in conjunction with the attached Drawing, wherein.

DETAILED DESCRIPTION OF THE INVENTION

Figure 1:
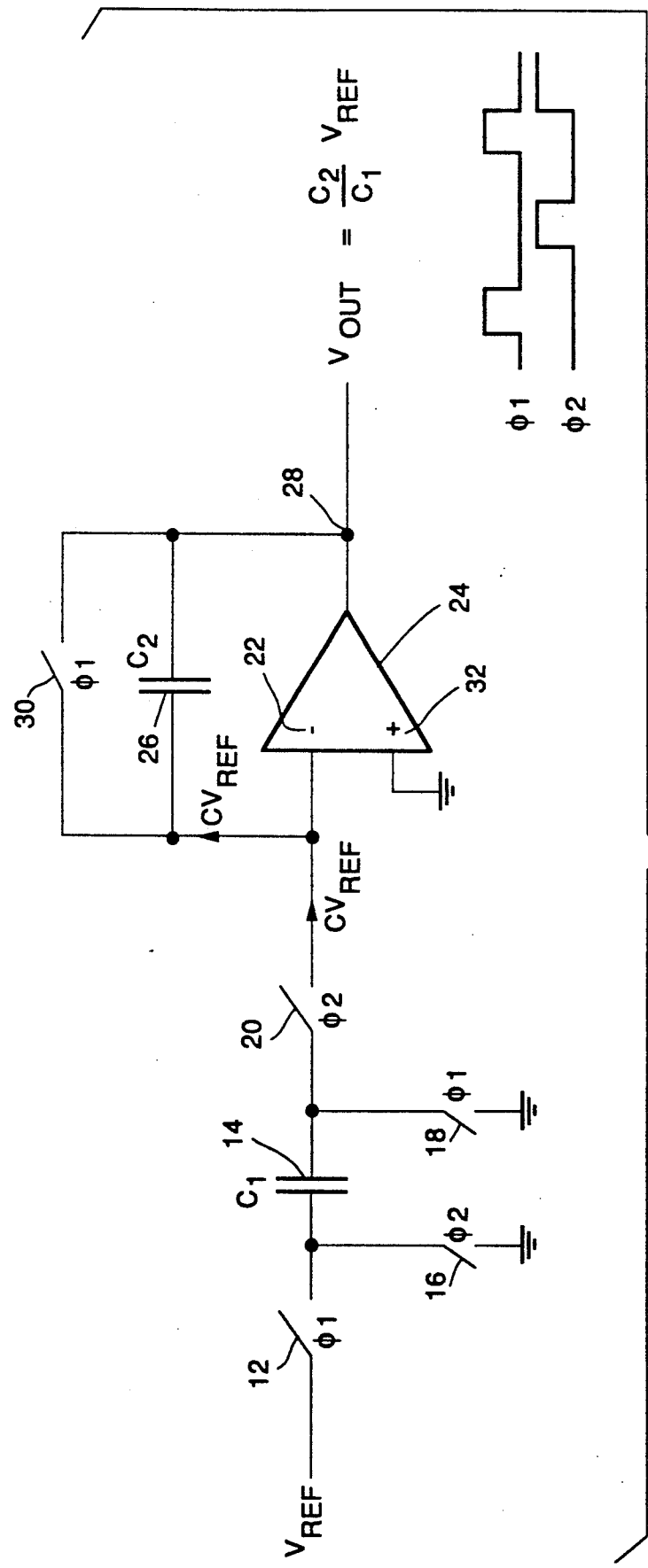
FIG. 1 illustrates a simplified switched capacitor circuit.

FIG. 1 shows at 10 a schematic of a simplified switched-capacitor circuit. In this illustrated switched capacitor circuit, reference voltage $V_{ref}$ is connected to switch 12 which is connected in turn to one side of capacitor 14 having a capacitance of $C_1$. Each side of capacitor 14 is switchably connected to ground through a respective switch 16 and 18. The other side of capacitor 14 is connected via switch 20 to input $V^-$ at terminal 22 (inverting terminal) of operational amplifier 24. Capacitor 26, having a capacitance $C_2$, is connected between input 22 and output terminal 28 of the operational amplifier 24. Switch 30 is connected in parallel with capacitor 26 to enable selective discharge of capacitor 26. The other input V+ (non-inverting terminal) shown at 32 of operational amplifier 24 is connected to ground.

In operation, reference voltage $V_{ref}$ is sampled onto the input capacitor 14, of capacitance $C_1$, on the first clock phase, $\Phi_1$, by opening the switches labeled $\Phi_2$ and closing those switches labeled $\Phi_1$, thereby storing a charge $Q_1 = CV_{ref}$. On clock phase $\Phi_2$, capacitor 14 is discharged into the V− node 22 by opening the switches labeled $\Phi_1$ and closing those switches labeled $\Phi_2$. In this condition, the operational amplifier 24 will force a current to flow from capacitor 26, ($C_2$), into V− which is equal to the current flowing from capacitor 14 ($C_1$) into V−. Thus, the voltage across capacitor 26 ($C_2$) and, hence, the output voltage at 28 becomes $(C_2/C_1)*Vref$. With appropriate adjustment of the ratio $C_2/C_1$, the output voltage may be set to any desired fraction of the reference voltage, Vref.

As mentioned previously, switched capacitor N-bit DAC's have conventionally been implemented by fixing a value of $C_2$ and selecting one of $2^N$ alternative values for $C_1$ by using C-2C ladders or N binary weighted capacitors to form $C_1$, because of the large number of possible values of $C_1$ for high resolution DACs. However, for low resolution DACs, such as those used in multi-bit sigma-delta data converters, it has now been found both feasible and desirable to have a unique capacitor for each desired value of $C_1$. This is the fundamental principle of operation of the low noise switched capacitor DAC in accordance with the invention.

Figure 2:
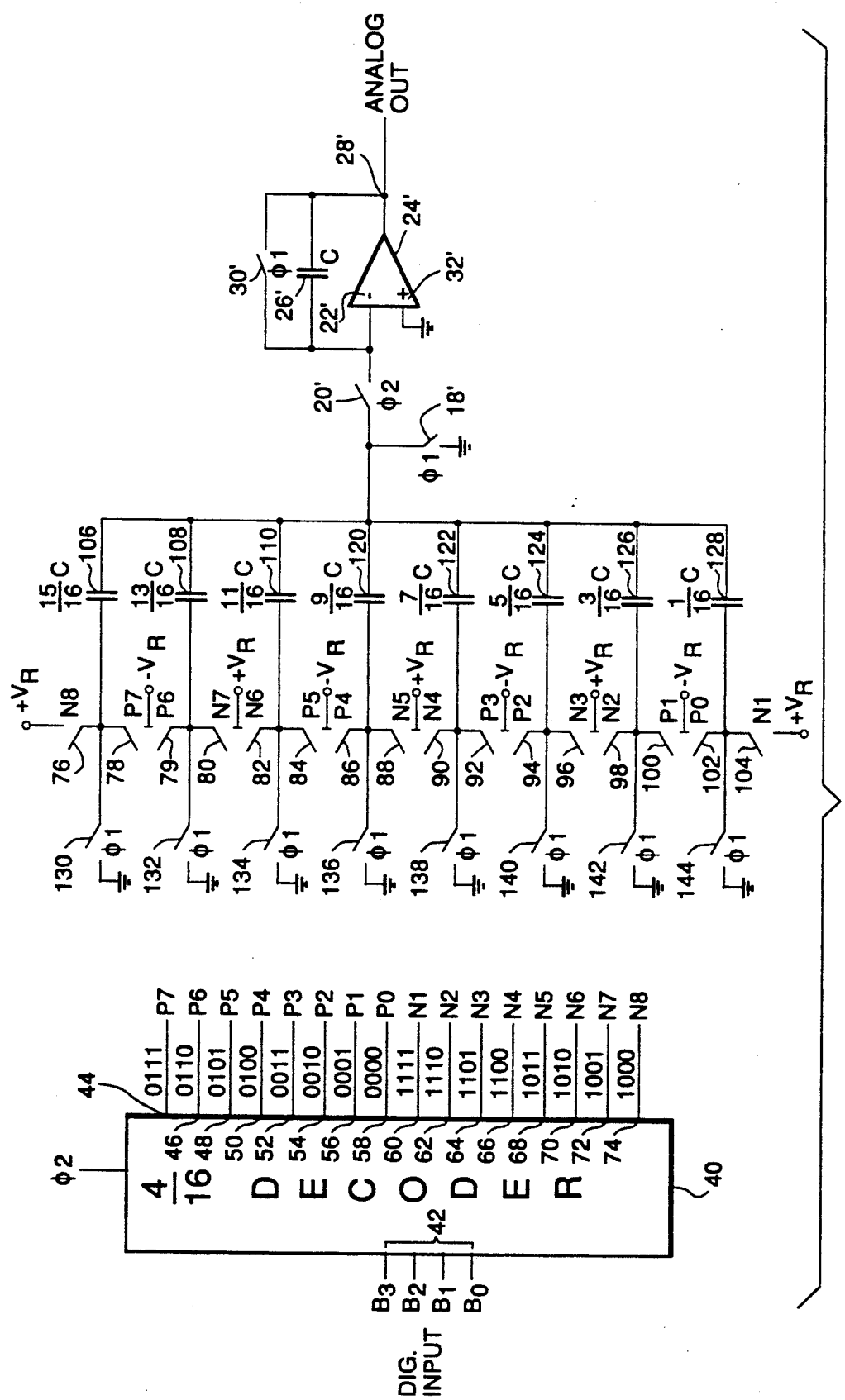
FIG. 2 shows in schematic form a 4-bit low-noise switched-capacitor DAC in accordance with the invention.

A full schematic for a 4-bit (16 level) embodiment of the low noise switched capacitor DAC in accordance with the invention is shown in FIG. 2. In this Figure, those elements which are equivalent to those in FIG. 1 are given the same number with the addition of a "prime" and will not be further described here except as required for discussion of the operation.

As seen in FIG. 2, a conventional decoder 40 is connected to receive a 4-bit binary input on input lines, collectively shown at 42, from a source (not shown). These input signals are decoded, suitably for example as shown in FIG. 2, in connection with each output signal line, to selectively drive one of the output signal lines 44 through 74 to a high state, in dependence upon the binary signal input at 42. The signal lines are connected respectively to switches 76 through 104, preferably arranged in pairs of switches as illustrated. It will be understood that these switches may be mosfets, transistor switches, mechanical relays or the like connected to the output signal lines through suitable drivers (not shown), as required.

One terminal of each pair of switches is respectively connected to one side of capacitors 106 through 128. The other side of each of the capacitors is connected to the junction of switches 18' and 20'. In a preferred embodiment capacitor 26' has a capacitance $C_2$ and the capacitors 106 through 128 have sequentially decreasing capacitance values of $(15/16)*C$, $(13/16)*C$ and so on as shown in FIG. 2.

Each switch of the plurality of switches 76 through 104 will, when closed, connect its respective capacitor to a positive reference voltage $+V_r$ or a negative reference voltage $-V_r$ as illustrated.

Switches 130 through 144 are respectively connected between each of the capacitors 106 through 128 and ground.

A detailed description of the operation of FIG. 2 is provided below.

When a 4-bit binary input is received on lines 42 it is decoded by decoder 40 so that one of the 16 switch-control lines (44 through 74) is driven high while the remainder remain low.

Preferably, all eight capacitors (106 through 128) are simultaneously discharged during the first clock phase, $\Phi_1$, by the closing of switches 130 through 144 in addition to the closing of switches 18' and 26', as previously described in connection with FIG. 1.

During the second clock phase, $\Phi_2$, only one of the nine capacitors is driven to either the positive or negative reference, as selected by the output signal on one of lines 44 through 74 selecting the appropriate switch among switches 76 through 104. This causes the output voltage to be driven to a value of $\pm(C_2/\alpha C_1)*Vref$, $\alpha$ = fraction preceding $C_1$ of the selected capacitor shown in FIG. 2.

Assume, as an example only and not as a limitation, that the input to decoder 40 is the binary pattern 1111. In this event, line 60, or output N1, goes high. N1 in the illustrated embodiment is connected to switch 104 and its selection causes the switch to close and the voltage $+V_r$ to be placed onto capacitor 128.

It will be appreciated that, in this scheme, a single capacitor can generate two DAC output levels $(\pm C_2/\alpha C_1)$. Thus only eight capacitors are necessary to implement all 16 levels. It will further be understood that this approach can be generalized for different numbers of bits.

Thus, although all capacitors are discharged (during $\Phi_1$ in FIG. 2) and, hence, will each "sample" its thermal noise of the discharge in switches, and will also contain a finite amount of charge injection, only one capacitor is connected to form the DAC output voltage (during $\Phi_2$ in FIG. 2). All other capacitors have one plate floating so that they do not contribute sampled thermal noise or charge injection to the DAC output voltage.

Thus, for an N-bit DAC, the kT/C thermal noise arising from switch on-resistance and switch charge injection is reduced over conventional approaches. Additionally, the low noise DAC of FIG. 2 can be easily modified as desired for a delaying ($\Phi_2$ output) or non-delaying ($\Phi_1$ output) configuration. The low noise DAC scheme can also be used in conjunction with a switched capacitor integrator, such as in a sigma-delta modulator loop, and can be extended for differential operation.

While the invention has been particularly shown and described with respect to a preferred embodiment thereof, it will be understood by those skilled in the art that changes in form and details may be made therein without departing from the scope and spirit of the invention.

What is claimed is:

1. Apparatus for digital-to-analog signal conversion comprising an operational amplifier having an output terminal and an input terminal, a reference capacitor connected between the output terminal and the input terminal, a plurality of capacitors switchably connected to the input terminal of the operational amplifier, each of said capacitors having a different capacitance value, means for selectively switchably connecting each of said plurality of capacitors to a voltage source for developing a voltage across said capacitors and said reference capacitor, and said switch means being operative for causing a selection of only an appropriate one of said capacitors in correspondence with any received digital signal to develop the voltage and the others to remain in a floating voltage state whereby thermal noise and charge injection of said others of the capacitors do not contribute such noise to the output signal level at the output terminal of the operational amplifier.

2. The apparatus of claim 1 wherein said switch means further comprises means for simultaneously discharging the plurality of capacitors.

3. The apparatus of claim 1 wherein the respective capacitances of the plurality of capacitors are decreasing fractions of a selected capacitance.

4. The apparatus of claim 1 wherein said switch means includes means for selectively applying another voltage source to the plurality of capacitors.

5. The apparatus of claim 1 wherein the switch means comprises a decoder wherein the digital signal is decoded to provide a switch selection signal to select one of the capacitors from said plurality of capacitors.

6. The apparatus of claim 5 wherein the switch means includes means for selectively applying another voltage source to the plurality of capacitors and the selection signal further selects the voltage source to be applied.

7. A DAC circuit comprising an operational amplifier having an output terminal, an inverting input terminal and a non-inverting input terminal; a reference capacitor connected between the output terminal and the inverting terminal; a plurality of capacitors switchably connected to the inverting terminal of the operational amplifier; means for switchably connecting each one of said plurality of capacitors to one of two voltage sources for developing a voltage across said one of said capacitors and said reference capacitor, and switch means operative for causing a selection of only an appropriate one of said capacitors in correspondence to any received digital signal to develop the voltage.

8. The apparatus of claim 7 wherein said switch means further comprises means for simultaneously discharging the plurality of capacitors.

9. The apparatus of claim 7 wherein the respective capacitances of the plurality of capacitors are decreasing fractions of a selected capacitance.

10. The apparatus of claim 7 wherein the switch means comprises a decoder wherein the digital signal is decoded to provide a switch selection signal to select one of the capacitors from said plurality of capacitors.

11. A method for converting a digital value to an analog signal level comprising the steps of providing an operational amplifier having an input terminal and an output terminal, connecting a reference capacitor between the input and output terminals, connecting a plurality of capacitors to the input terminal, selecting only an appropriate one of said plurality of capacitors in correspondence with any determined digital input value and applying a voltage thereto to establish a selected voltage output at the output terminal of the operational amplifier while allowing each of the others of said plurality of capacitors to remain in a floating voltage state. whereby thermal noise and charge injection of said others of the capacitors will not contribute such noise to the output signal level at the output terminal of the operational amplifier.

12. The method of claim 11 wherein the step of selecting one of the plurality of capacitors further comprises the step of decoding the input digital value and providing a selection signal in accordance with the digital signal.

13. The method of claim 11 further comprising the step of discharging each of the plurality of capacitors prior to the step of applying voltage to the selected one of the capacitors.

* * * * *